United States Patent
Orofino, II

(10) Patent No.: US 7,580,962 B1
(45) Date of Patent: Aug. 25, 2009

(54) AUTOMATIC CODE GENERATION FOR CO-SIMULATION INTERFACES

(75) Inventor: Donald P. Orofino, II, Sudbury, MA (US)

(73) Assignee: The MathWorks, Inc., Natick, MA (US)

(*) Notice: Subject to any disclaimer, the term of this patent is extended or adjusted under 35 U.S.C. 154(b) by 823 days.

(21) Appl. No.: 10/637,897

(22) Filed: Aug. 8, 2003

(51) Int. Cl.
*G06J 1/00* (2006.01)
(52) U.S. Cl. .................... 708/8; 703/22; 703/13
(58) Field of Classification Search .......... 434/29, 434/30, 37; 713/13, 14, 21, 22, 24, 26; 708/8; 703/22, 13
See application file for complete search history.

(56) References Cited

U.S. PATENT DOCUMENTS 6,425,762 B1 * 7/2002 Ernst ..................... 434/29
7,146,300 B2 * 12/2006 Zammit et al. .......... 703/13

* cited by examiner

*Primary Examiner*—Huyen X. Vo
(74) *Attorney, Agent, or Firm*—Lahive & Cockfield, LLP; Kevin J. Canning

(57) ABSTRACT

A method of programmatically generating code from the elements of a system simulation is disclosed. The programmatic code generation includes the ability to generate code for foreign code associated with a co-simulation element. The programmatic code generation may incorporate the foreign code by means of a function or procedure call or alternatively by integrating or in-lining the foreign code directly within the body of the generated code. Depending upon whether or not the foreign code is in a different language than the code being programmatically generated, a native language wrapper may be required to be inserted around the foreign code.

24 Claims, 4 Drawing Sheets

AUTOMATIC CODE GENERATION FOR CO-SIMULATION INTERFACES

FIELD OF THE INVENTION

The illustrative embodiment of the present invention relates generally to programmatic code generation, and more particularly to the use of co-simulation interfaces in the automatic generation of code.

BACKGROUND OF THE INVENTION

Computer simulation environments simulate the operation of dynamic systems. The simulators represent the various components of the systems being simulated with simulation elements. The simulation elements may be graphical or text-based and may represent both functional and non-functional components. Frequently, the component being simulated includes foreign code segments which are written in a non-native language (i.e.: not the language of the simulator). In such a case, an interface is created in the simulation environment to a foreign compiler or foreign simulator capable of executing the foreign code. The use of an interface to the foreign environment that allows the simulation of the foreign code is referred to as co-simulation.

Co-simulation offers a user the ability to simulate program code written in languages other than that which the simulation environment natively supports. This includes the simulation of non-native architecture-specific machine codes from within the host simulation environment. For a simulation environment such as Simulink® from the MathWorks, Inc. of Natick, Mass., a special purpose block for use with Simulink may be added to a block diagram that allows simulation of external codes. For a simulation environment such as MATLAB from the MathWorks, Inc., co-simulation may require a function or object that is utilized within a user's M code or directly from the command prompt, thereby allowing simulation of external code.

Unfortunately, simulation using conventional methods of co-simulation does not facilitate programmatic code generation following the simulation. In particular, conventional methods of programmatic code generation based on the results of the simulation of a system are unable to programmatically generate code for the foreign code associated with the co-simulation element. The foreign code associated with the co-simulation element must often be hand coded into the generated code, a process that is time consuming, inefficient, and prohibits the block diagram from providing a complete and turn-key solution for automatic code generation.

BRIEF SUMMARY OF THE INVENTION

The illustrative embodiment of the present invention provides the ability to programmatically generate code from the elements of a system simulation. The programmatic code generation includes the ability to generate code for foreign code associated with a co-simulation element. The programmatic code generation may account for the foreign code by means of a function or procedure call or alternatively by integrating or in-lining the foreign code directly within the body of the generated code. Depending upon whether or not the foreign code is in a different language than the code being programmatically generated, a native language wrapper may be required to be inserted around the foreign code.

In one embodiment, a host simulation environment with a native language prepares a simulation of a dynamic system. The components of the dynamic system being simulated are represented in the simulation environment with a plurality of simulation elements. The simulation includes at least one co-simulation element that represents a component of the dynamic system being simulated which is associated with foreign code written in a non-native language. The co-simulation element interfaces the simulation environment with a foreign simulator or compiler capable of handling the foreign code. Code is then programmatically generated using the simulation elements and at least one co-simulation element.

In another embodiment, a simulation system includes a simulation environment with a native language and a co-simulation element. The simulation environment prepares a simulation of a dynamic system. The dynamic system includes a plurality of components represented by a plurality of simulation elements in said simulation environment. The co-simulation element represents a component of the dynamic system that is associated with foreign code, code written in a non-native language. The co-simulation element interfaces the simulation environment with at least one foreign compiler and foreign simulator capable of operating on the foreign code. The simulation elements and at least one co-simulation element are used to programmatically generate code.

DETAILED DESCRIPTION

The ability to programmatically generate code from simulations of dynamic systems which include components of the dynamic system which are associated with foreign code represents an extension of the functionality of simulation design systems. The programmatic generation of code for the foreign code associated with the co-simulation element avoids the hand coding required in conventional systems. The programmatic code generation results in a quicker and more accurate code generation process than is currently available.

Figure 1:
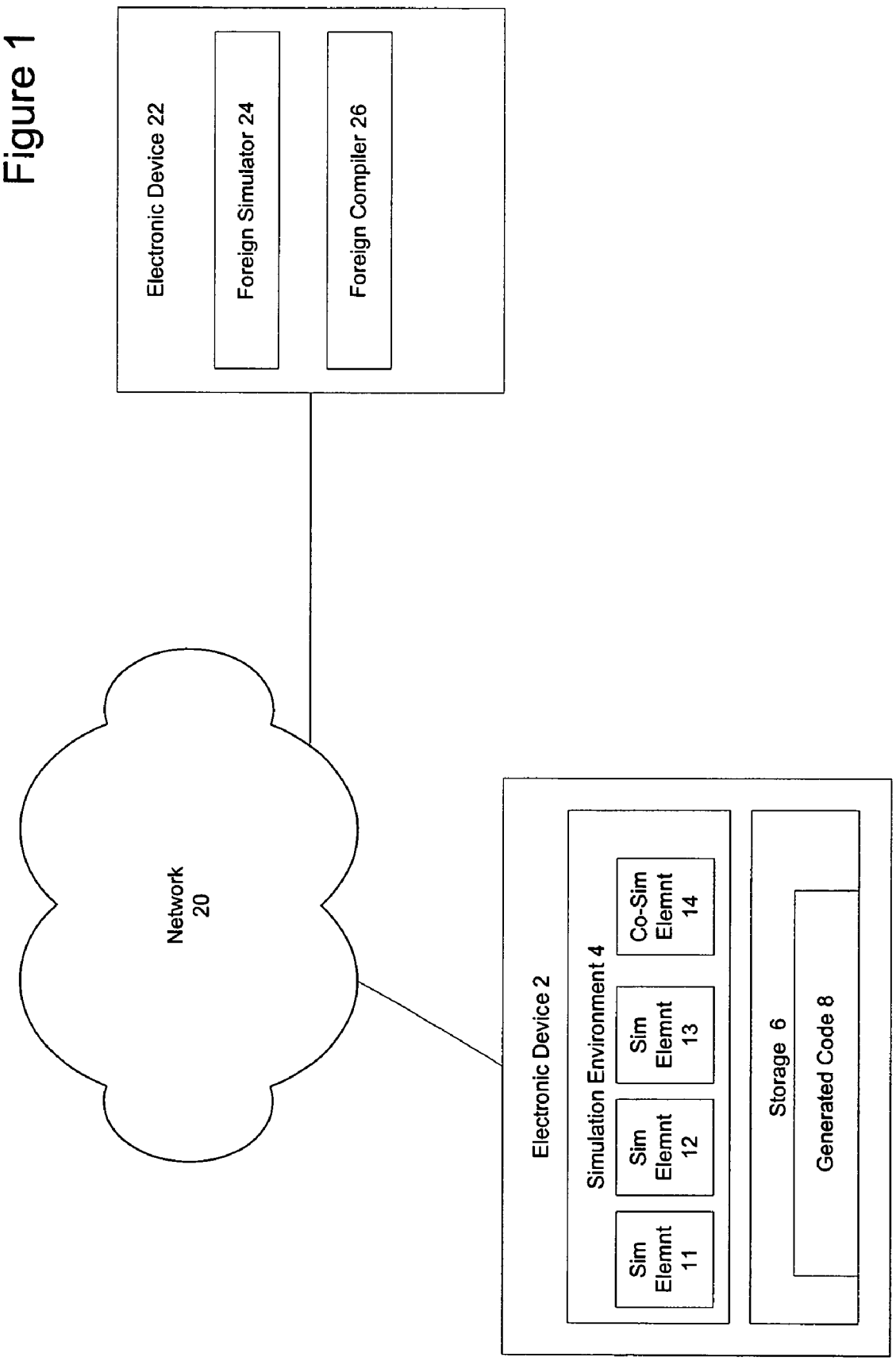
FIG. 1 depicts a block diagram of an environment suitable for practicing the illustrative embodiment of the present invention.

FIG. 1 depicts a block diagram of an environment suitable for practicing the illustrative embodiment of the present invention. An electronic device 2 includes a simulation environment 4 and storage 6. The electronic device 2 may be a mainframe, server, workstation, laptop or other electronic device with a processor. The simulation environment 4 may be a simulation environment such as MATLAB® or Simulink®. The simulation environment 4 simulates the functioning of a dynamic system by modeling system components with simulation elements 11, 12 and 13 and co-simulation element 14. The co-simulation element 14 represents a dynamic system component associated with foreign code. The foreign code is code which is in a non-native language to that of the simulation environment. For example, the programming languages VHDL, C++ and Ada would be foreign languages to a simulation environment based on the programming languages M or C. The electronic device 2 may be interfaced with a network 20 and another electronic device 22 holding a foreign code simulator 24 and a foreign compiler 26 capable of operating on the foreign code associated with the co-simulation element 14. The network 20 may be a local area network (LAN), a wide area network (WAN), an intranet, the Internet, or some other type of network.

The simulation of the dynamic system, including the component associated with foreign code, may be used as the basis for programmatic code generation. The programmatically generated code 8 may be stored in storage 6 on the electronic device 2. Alternatively, those skilled in the art will recognize that the generated code may be stored elsewhere in other storage locations accessible over the network 20. Additionally, those skilled in the art will recognize that the foreign simulator 24 and foreign compiler 26 may also be located on the electronic device 2 but reside in a separate address space than that of the simulation environment 4.

The electronic device 2 holding the simulation environment 4 also includes a medium holding computer-executable instructions for implementing a method as the instructions are executed. The method includes the steps of preparing a simulation of a dynamic system in the simulation environment, the simulation environment representing a plurality of components of the dynamic system with a plurality of simulation elements. The method also includes providing at least one co-simulation element in the simulation, the co-simulation element representing a component of the dynamic system associated with foreign code, the foreign code being written in a non-native language. The co-simulation element interfaces the simulation environment to at least one of a foreign simulator and compiler, the at least one of a foreign simulator and compiler being suitable for operating on code written in the language of the foreign code. The method further includes programmatically generating code using the simulation elements and the at least one co-simulation element.

Figure 2:
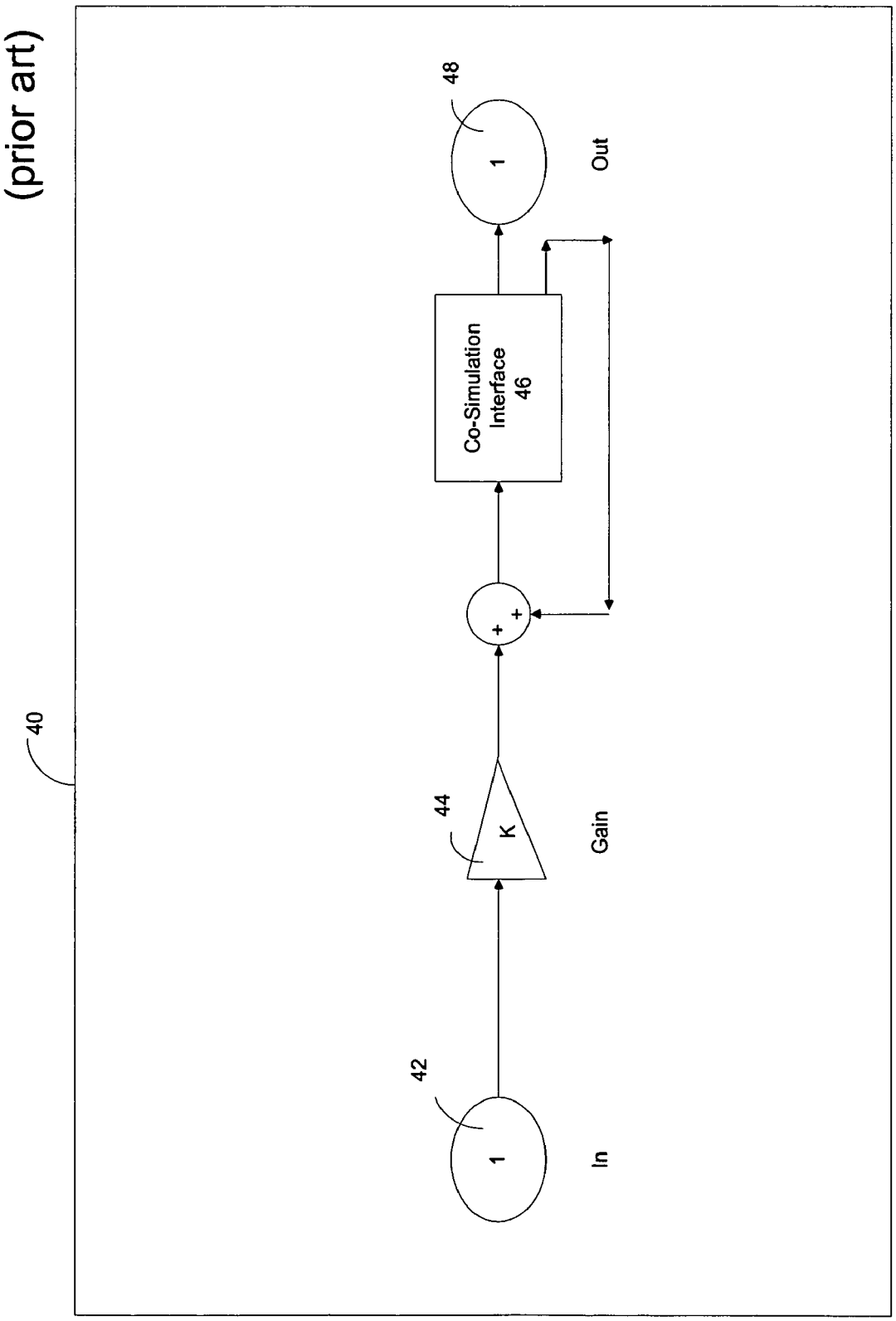
FIG. 2 depicts a prior art block diagram of a simulation design system including a co-simulation element representing a component associated with foreign code.

FIG. 2 is a block diagram of a prior art simulation environment 40. The simulation environment 40 is modeling the execution of a dynamic system that includes an input element 42, a gain block 44, a co-simulation element 46 and an output element 48. The co-simulation element 46 represents a component in the dynamic system being modeled that is associated with foreign code that is written in a language that is different than the native language of the simulation environment 40. The co-simulation element 46 interfaces the simulation environment 40 with the foreign simulator 24 or foreign compiler 26, thereby allowing simulation of the foreign code associated with the system component. More than one co-simulator element may appear in the simulation environment 40 at the same time.

There are several ways within the present invention to achieve programmatic code generation using a co-simulation element representing a dynamic system component associated with foreign code. In one implementation, the code generation is the result of a procedure-based call constructed such that the foreign code is called from the generated application. The nature of the code automatically generated with a procedure-based call depends on whether the code is in the same or different language than the body of the generated application.

Figure 3:
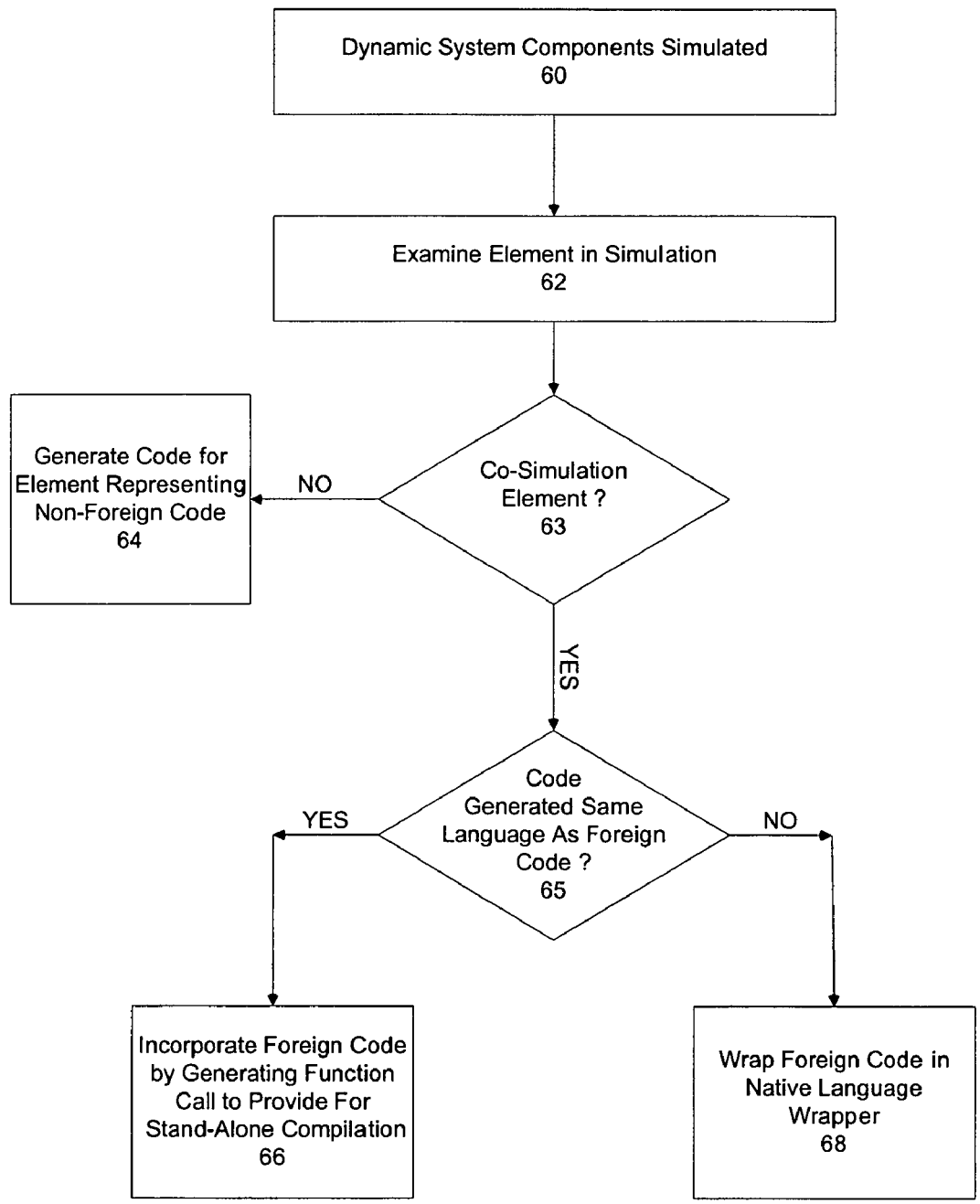
FIG. 3 depicts a flow-chart of the sequence of steps followed by the illustrative embodiment of the present invention to programmatically generate code from a co-simulation element of a system simulation by means of a function or procedure call.

FIG. 3 is a flow-chart of the sequence of steps followed by the illustrative embodiment of the present invention to programmatically generate code using a procedure or function call. The sequence of steps begins when the components in the dynamic system are simulated using simulation elements and co-simulation elements to represent the system components in the simulation environment (step 60). Simulation elements are assigned to components modeled with native code and co-simulation elements are used for system components modeled with foreign code. The co-simulation element provides an interface to a foreign simulator or compiler capable of operating on the foreign code. Each element in the simulation environment is then examined in turn (step 62). If the element is not a co-simulation element (step 63), the code is generated for the element representing non-foreign code by translating the representative element into native code.

If the element being examined is a co-simulation element (step 63), the element is examined to determine whether the foreign code associated with the co-simulation element is in the same language as the code that is being generated programmatically (step 65). If the code being generated is the same language as the foreign code associated with the co-simulation element, the foreign code is incorporated via a function call or procedure call to provide for a stand-alone compilation (step 66). The function or procedure call generally involves the automatic generation of header or definition codes, one or more properly constructed procedure calls from the body of the generated code, and optional generation of development tool support files used to locate the co-simulation code and successfully complete automated compilation and the linking of the application.

Alternatively, if the co-simulation element represents a component associated with foreign code which is not in the same language as the code being generated programmatically (step 65), the foreign code represented by the co-simulation element is incorporated by generating a native language wrapper that is written in the same language as the code being generated (step 68). The wrapper surrounds the foreign code and enables the function call to be made on behalf of the foreign code. The sequence is repeated until all of the elements in the simulation have been examined. Those skilled in the art will recognize that the ability to successfully accomplish this interfacing is generally constrained by the capabilities of the native and foreign languages, the development tools, or other factors beyond the control of the simulation environment.

Figure 4:
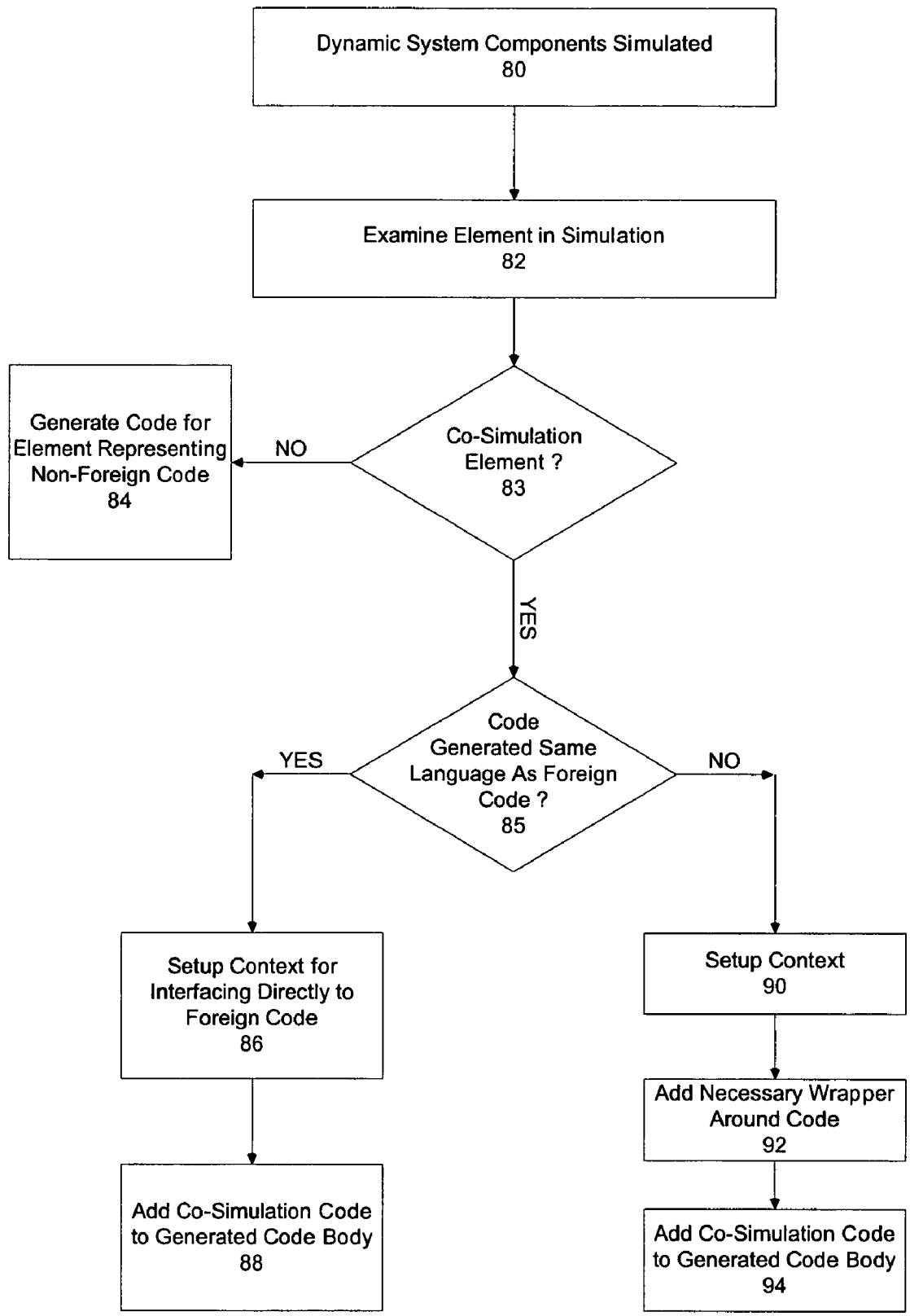
FIG. 4 is a flow-chart of the sequence of steps followed by the illustrative embodiment of the present invention to perform programmatic code generation utilizing a co-simulation element of a simulation by means of integrating the foreign code in-line with the programmatically generated code.

Another way within the present invention to achieve code generation for a co-simulation element is to integrate or in-line the code directly within the body of the generated code. The nature of the code automatically generated to integrate the co-simulation code into a final application again depends on whether the foreign code is in the same or different language than the body of the generated application. FIG. 4 depicts the sequence of steps followed by the illustrative embodiment of the present invention to perform programmatic code generation by in-lining foreign code using a co-simulation element directly into the programmatically generated code. The sequence of steps begins when the components in the dynamic system are simulated using simulation elements and co-simulation elements to represent the system components in the simulation environment (step 80). Each element in the simulation is then examined (step 82). If the element is not a co-simulation element (step 83), the code is generated by retrieving the native language code represented by the native language element (step 84).

Alternatively, if the element is a co-simulation element (step 83) the co-simulation element is examined to determine if the code being programmatically generated is in the same language as the foreign code language (step 85). If the foreign code language is the same language as the code being generated, the proper context is set up for interfacing directly to the foreign code (step 86) and the co-simulation block code is added directly to the body of the generated code (step 88). The setup of the context for integration refers to the automatic generation of interface code to allow the in-lining of the foreign code. The context that needs to be set up when the foreign code language is the same as the language of the code being generated generally involves the setting up of input and output variables, data pointers, and parameter variables suitable for interfacing directly to the external code. If the code being generated is in a language different from the language of the foreign code associated with the co-simulation element, the context is prepared to integrate the code (step 90). The method of preparing the context when the foreign code is written in a different language than the code being generated may be specific to the set of development tools being utilized. For example, "ASM" statements may be generated for a compiler to allow assembly code to be in-lined within a higher level language. Following the preparation of the context, a language wrapper of code around the foreign code is added (step 92). The wrapper code is in the same language as the rest of the code being generated and enables the foreign code to interface with the rest of the program or code being generated. The code associated with the co-simulation element is then added to the code body (step 94). The sequence of steps is repeated until all of the elements in the simulation have been examined.

The ability to programmatically generate code including foreign code segments from simulation elements may require the automatic generation of code to influence system resource utilization or allocation. The system resources include memory spaces and other system resources specifically required by the foreign code. An interface may be provide in which these specific resource requirements are conveyed to the application, or the requirements may be deduced from the definition of the foreign code.

Although the examples discussed above have focused on the simulation of code being performed followed by the programmatic generation of code using the simulation elements, another sequence of steps within the scope of the present invention should also be noted. The design environment may have existing design components that offer simulation characteristics similar to (or even identical to) the characteristics of the co-simulation code. In such a situation, it may be desirable to utilize the foreign code only during the programmatic generation of code but not during the simulation since the components native to the design environment may simulate significantly faster than the foreign co-simulation code. In such a case, the simulation elements are generated as described above, replaced during simulation, and restored during programmatic code generation.

Since certain changes may be made without departing from the scope of the present invention, it is intended that all matter contained in the above description or shown in the accompanying drawings be interpreted as illustrative and not in a literal sense. Practitioners of the art will realize that the system configurations depicted and described herein are examples of multiple possible system configurations that fall within the scope of the current invention. Likewise, the sequence of steps utilized in the illustrative flowcharts are examples and not the exclusive sequence of steps possible within the scope of the present invention.

I claim:

1. In an electronic device implementing a host simulation environment with a native language, a computer-implemented method comprising:

preparing, using the electronic device, a simulation of a dynamic system in the simulation environment, the simulation environment representing a plurality of components of the dynamic system with a plurality of simulation elements;

providing, using the electronic device:
   at least one simulation element in the simulation, the simulation element representing a component of the dynamic system associated with native code written in the native language, and
   at least one co-simulation element in the simulation, the co-simulation element representing a component of the dynamic system associated with foreign code written in a non-native language, the co-simulation element interfacing the simulation environment to at least one of a foreign simulator and compiler, the at least one of a foreign simulator and foreign compiler suitable for operating on code written in the non-native language;

generating, using the electronic device, an application by programmatically generating code associated with the at least one simulation element and the at least one co-simulation element, without a user of the host simulation environment having to hand code for the component of the dynamic system associated with the foreign code; and storing the application in a storage device.

2. The method of claim 1, further comprising:
determining, using the electronic device, whether the programmatically generated code is in the same language as the foreign code; and
incorporating the foreign code associated with the co-simulation element, using the electronic device, by generation of a function call.

3. The method of claim 1, further comprising:
determining, using the electronic device, whether the programmatically generated code is in a language that differs from the language of the foreign code; and
incorporating the foreign code associated with the co-simulation element, using the electronic device, by generating a native language wrapper for the foreign code, the wrapper allowing the foreign code to be accessed from within the programmatically generated code.

4. The method of claim 1, further comprising:
integrating the foreign code, using the electronic device, directly within the body of the programmatically generated code.

5. The method of claim 4, further comprising:
determining, using the electronic device, whether the programmatically generated code is in the same language as the foreign code; and
setting up, using the electronic device, at least one of input or output variables, data pointers, and parameter variables, suitable for interfacing directly to the foreign code.

6. The method of claim 4, further comprising:
determining, using the electronic device, whether the programmatically generated code is in a language that differs from the language of the foreign code; and
incorporating the foreign code, using the electronic device, by wrapping the foreign code with a native language wrapper allowing the foreign code to be accessed from within the generated code.

7. The method of claim 6 wherein the wrapper is an ASM statement for a compiler thereby allowing assembly code to be integrated into a higher-level language program.

8. The method of claim 1 wherein the generated code causes at least one of the allocation and utilization of system resources.

9. The method of claim 8 wherein the system resource is a memory address range specifically required by the foreign code.

10. The method of claim 1 wherein more than one co-simulation element is included in the simulation.

11. The method of claim 1 wherein the at least one of a foreign simulator and foreign compiler are interfaced with the simulation environment over a network.

12. An electronic device comprising:
a processor configured to process:
a simulation environment having a native language,
a simulation of a dynamic system in the simulation environment, the simulation of the dynamic system based on:
a plurality of simulation elements in the simulation environment, and
a co-simulation element in the simulation environment representing a component of the dynamic system associated with foreign code, the foreign code being written in a non-native language, the co-simulation element interfacing the simulation environment with at least one of a foreign simulator and foreign compiler, the at least one of a foreign simulator and foreign compiler suitable for operating on code written in the language of the foreign code, and
a code generator for generating an application by programmatically generating code after simulating the dynamic system, the code generator programmatically generating the code based on the co-simulation element used with the simulation elements in the simulation, the code generator programmatically generating the code without a user of the simulation environment having to hand code for the component of the dynamic system associated with foreign code; and
a storage device for storing the simulation environment and the co-simulation element.

13. The electronic device of claim 12 wherein the code is being generated in the same language as the foreign code and the code for the foreign code associated with the co-simulation element is incorporated using a function call.

14. The electronic device of claim 12 wherein the code is not being generated in the same language as the foreign code; and the foreign code associated with the co-simulation element is generated by wrapping the foreign code with a native language wrapper thereby allowing the foreign code to be accessed from within the generated code.

15. The electronic device of claim 12 wherein the foreign code is integrated directly within the body of the generated code.

16. In an electronic device executing a host simulation environment that includes a native language, a storage medium holding computer instructions executable by a processor of the electronic device for performing:
preparing a simulation of a dynamic system in the simulation environment, the simulation environment representing a plurality of components of the dynamic system with a plurality of simulation elements;
providing at least one co-simulation element in the simulation, the co-simulation element representing a component of the dynamic system associated with foreign code, the foreign code being written in a non-native language, the co-simulation element interfacing the simulation environment to at least one of a foreign simulator and compiler, the at least one of a foreign simulator and foreign compiler suitable for operating on code written in the language of the foreign code;
performing the simulation of the dynamic system; and
programmatically generating code associated with the plurality of simulation elements and the at least one co-simulation element after simulating the dynamic system in generating an application, the code being generated without a user of the host simulation environment having to hand code for the component of the dynamic system associated with foreign code.

17. The medium of claim 16 wherein the method further comprises:
determining that the code being generated is in the same language as the foreign code; and
incorporating the code for the foreign code associated with the co-simulation element by generating a function call.

18. The medium of claim 16 wherein the method further comprises:
determining that the code being generated is not in the same language as the foreign code; and
incorporating the code for the foreign code associated with the co-simulation element by generating a native language wrapper for the foreign code thereby allowing the foreign code to be accessed from within the generated code.

19. The medium of claim 16 wherein the method further comprises:
integrating the foreign code directly within the body of the generated code.

20. The medium of claim 19 wherein the method further comprises:
determining that the code being generated is in the same language as the foreign code; and
setting up at least one of input or output variables, data pointers, and parameter variables, suitable for interfacing directly to the external code.

21. The medium of claim 19 wherein the method further comprises:
determining that the code being generated is not in the same language as the foreign code; and
generating the code representing the foreign code by wrapping the foreign code with a native language wrapper allowing the foreign code to be accessed from within the generated code.

22. The medium of claim 16 wherein the generated code causes at least one of the allocation and utilization of a memory address range specifically required by the foreign code.

23. The medium of claim 16 wherein more than one co-simulation element is included in the simulation.

24. The medium of claim 16 wherein the at least one of a foreign simulator and foreign compiler are interfaced with the simulation environment over a network.

* * * * *